(12) United States Patent
Ishikawa et al.

(10) Patent No.: US 6,717,492 B2
(45) Date of Patent: Apr. 6, 2004

(54) PLANAR DIELECTRIC INTEGRATED CIRCUIT WITH LINE CONVERSION CONDUCTOR PATTERNS

(75) Inventors: Yohei Ishikawa, Kyoto-fu (JP); Koichi Sakamoto, Kyoto-fu (JP); Sadao Yamashita, Kyoto-fu (JP); Kenichi Iio, Kyoto-fu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 1 day.

(21) Appl. No.: 10/072,533

(22) Filed: Feb. 8, 2002

(65) Prior Publication Data

US 2002/0089385 A1 Jul. 11, 2002

Related U.S. Application Data

(62) Division of application No. 09/031,981, filed on Feb. 26, 1998, now Pat. No. 6,445,255.

(30) Foreign Application Priority Data

Feb. 27, 1997 (JP) ................................................ 9-44162

(51) Int. Cl.⁷ ................................ H01P 7/10; H03B 7/14
(52) U.S. Cl. ...................... 333/219.1; 333/250; 333/33; 330/286; 331/107 DP; 331/117 D
(58) Field of Search ................................ 333/248, 250, 333/219.1, 33, 202; 330/286; 331/107 DP, 117 D

(56) References Cited

U.S. PATENT DOCUMENTS 5,872,485 A * 2/1999 Ishikawa et al. ......... 333/250 X
6,445,255 B1 * 9/2002 Ishikawa et al. ...... 331/107 DP

FOREIGN PATENT DOCUMENTS

EP 735604 * 10/1996

* cited by examiner

*Primary Examiner*—Benny Lee
(74) *Attorney, Agent, or Firm*—Dickstein, Shapiro, Morin & Oshinsky, LLP.

(57) ABSTRACT

A planar dielectric integrated circuit is provided such that energy conversion loss between a planar dielectric line and electronic components is small and that impedance matching between them can be easily obtained. A planar dielectric line is provided by causing two slots to oppose each other with a dielectric plate interposed in between, a slot line and line-conversion conductor patterns are provided in the end portions of the planar dielectric line, and an FET is disposed in such a manner as to be extended over the slot line.

16 Claims, 8 Drawing Sheets

PLANAR DIELECTRIC INTEGRATED CIRCUIT WITH LINE CONVERSION CONDUCTOR PATTERNS

This is a division of application Ser. No. 09/031,981, filed Feb. 26, 1998, now U.S. Pat. No. 6,445,255.

BACKGROUND OF THE INVENTION

1. Field of the Invention

The present invention relates to a planar dielectric integrated circuit for use in a millimetric-wave band and a microwave band.

2. Description of the Related Art

In a millimetric-wave band and a microwave band, transmission lines have often been used which are constructed by forming a conductor on a dielectric substrate of a waveguide, a coaxial line, a microstrip line, a coplanar line, a slot line, and the like. In particular, in a dielectric substrate having a transmission line formed thereon, since connection with electronic components, such as ICs, is easy, many attempts to form an integrated circuit by mounting electronic components onto a dielectric substrate have been made.

However, in the conventional microstrip line, coplanar line, slot line, and the like, since transmission loss is relatively large, these are not suitable for a circuit requiring, particularly, a low transmission loss. Therefore, the applicant of the present invention submitted the invention concerning a planar dielectric line and an integrated circuit, which solve these problems, in Japanese Patent Application No. 07-069867.

Meanwhile, since the distribution of electromagnetic field around input/output sections of electronic components, such as semiconductor devices, and the distribution of electromagnetic field around planar dielectric lines generally differ, merely mounting electronic component onto the planar dielectric line causes the conversion loss to increase greatly. Further, if electronic components are only mounted onto one surface of the dielectric plate, no connection is made between the electro magnetic field on the back surface thereof and the electronic components, this point also leading to an increase in the conversion loss. Mounting electronic components onto both surfaces of the dielectric plate eliminates the latter problem; however, this results in a decrease in the yield, an increase in loss, and an increase in the material and mounting costs.

SUMMARY OF THE INVENTION

An object of the present invention is to provide a planar dielectric integrated circuit such that energy conversion loss between the planar dielectric line and the electronic components is small, and impedance matching between them is obtained easily.

According to the aspect of the present invention, to perform integration by reducing a signal loss in the coupled section of the planar dielectric line and the electronic components and while maintaining a low loss characteristic, which is a feature of the planar dielectric line, a planar dielectric line is formed such that two conductors are provided at a fixed distance on a first main surface of a dielectric plate to provide a first slot, two conductors are provided at a fixed distance on a second main surface of a dielectric plate to provide a second slot which opposes the first slot, with the area sandwiched between the first slot and the second slot of the dielectric plate being formed as a plane-wave propagation area. A slot line is formed at the end portion of the planar dielectric line of the dielectric plate, a line-conversion conductor pattern which is connected to the planar dielectric line and is used to perform mode conversion with the slot line is provided in the slot line, and electronic components are disposed in such a manner as to be extended over the slot line.

An RF signal of the LSM mode, which propagated through the planar dielectric line as described above, is coupled to the line-conversation conductor pattern, is converted into a TE mode, and propagated through the slot line. The signal which propagated through this slot line is inputted to the electronic components. Conversely, the signal outputted from the electronic components propagates through the slot line in the TE mode, is converted into the LSM mode by the line-conversion conductor pattern, and propagates through the planar dielectric line.

Preferably, the line-conversion conductor pattern is provided at positions on both ends of the slot line, and the electronic components are disposed in nearly the central portion of the slot line. As a result, when the signal is propagated from one planar dielectric line of the two planar dielectric lines to the other planar dielectric line, the signal is converted into the mode of the slot line at the midpoint by the line-conversion conductor pattern and the slot line, and signal conversion, for example, amplification, is performed by the electronic components, and then the signal is returned to the mode of the planar dielectric line via the line-conversion conductor pattern. Therefore, signal conversion using the electronic components is made possible with a construction with a small energy conversion loss while performing the propagation of a signal using the planar dielectric line.

Preferably, a short stub which is used to obtain impedance matching between the line-conversion conductor pattern and the electronic components is provided at the midpoint of the slot line. As a result, impedance matching is obtained between the line-conversion conductor pattern and the electronic components, and the loss in the connection section of the slot line and the electronic components is reduced.

Further, preferably, an impedance matching circuit is provided between the line-conversion conductor pattern and the slot line. As a result, impedance matching is obtained between the line-conversion conductor pattern and the planar dielectric line, and the slot line, thereby suppressing unwanted reflection and reducing the transmission loss caused by line conversion.

The above and further objects, aspects and novel features of the invention will become more apparent from the following detailed description when read in connection with the accompanying drawings. In the drawings, like references denote like elements and parts and accordingly each references may not be described in connection with each specific drawing in which it appears.

DESCRIPTION OF THE PREFERRED EMBODIMENTS

The construction of a high-frequency amplifier according to a first embodiment of the present invention will be described with reference to FIGS. 1A and 1B, 2, 3, 4, 5 and 6.

Figure 1A:
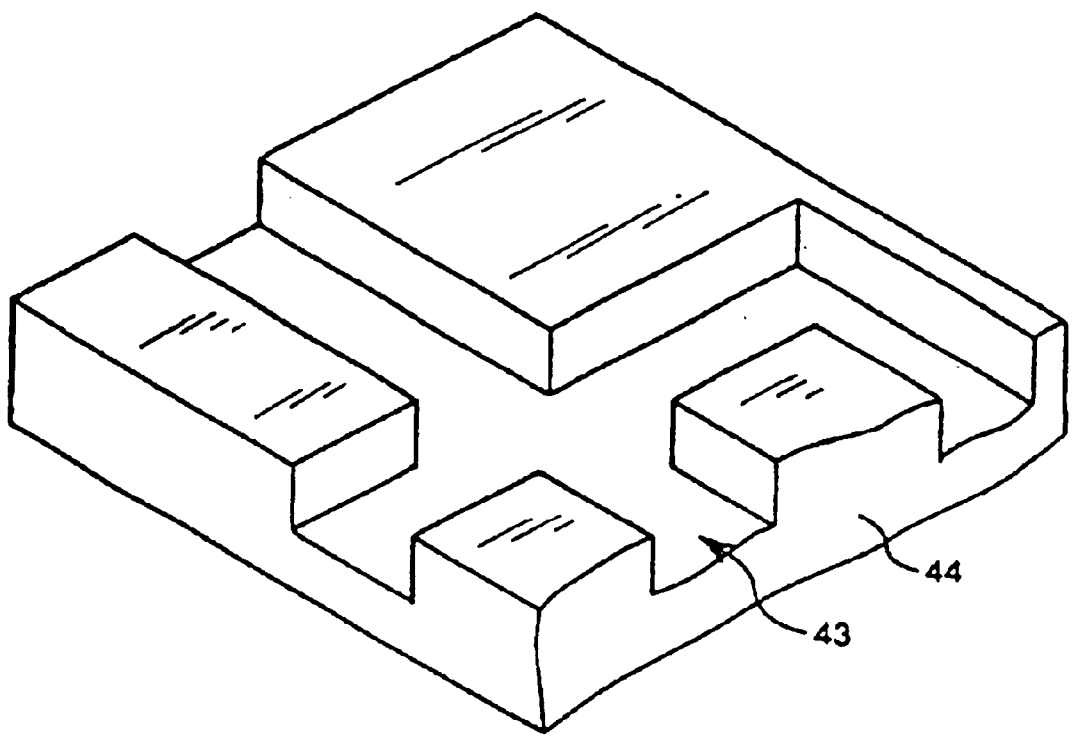
FIGS. 1A and 1B are partial, exploded perspective views showing the construction of a high-frequency amplifier according to a first embodiment of the present invention.
Figure 1B:
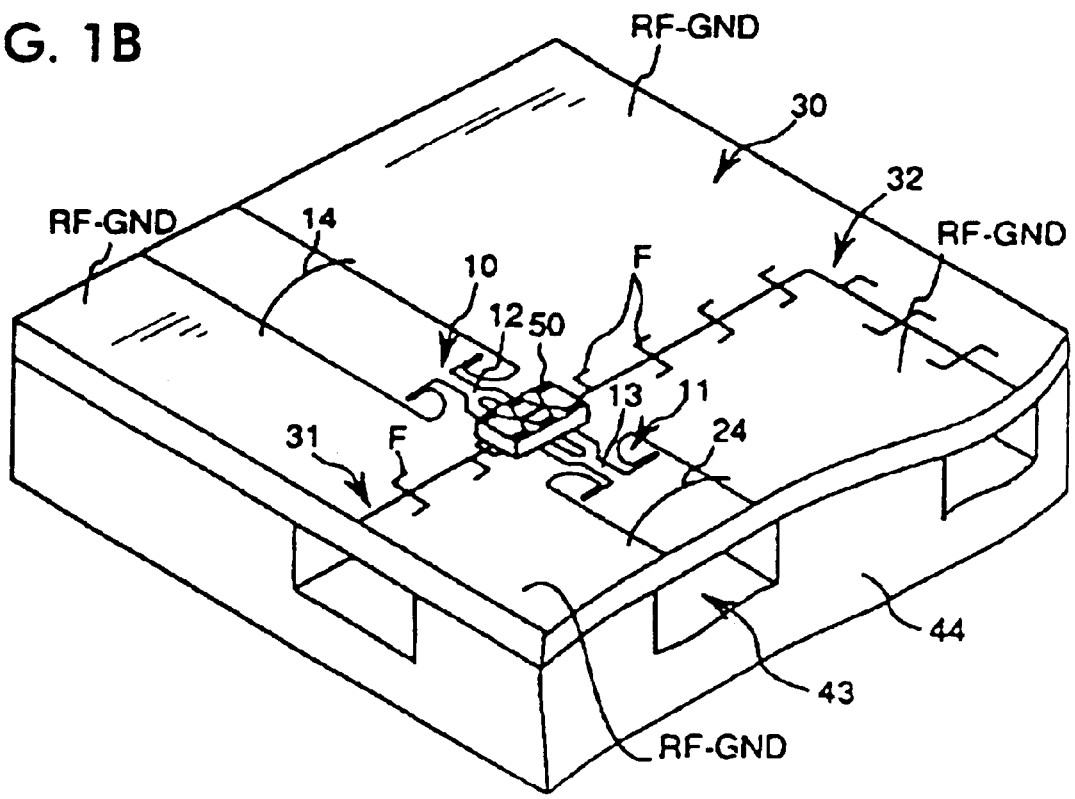

FIGS. 1A an 1B are partial, exploded perspective views showing the construction of the high-frequency amplifier. FIG. 1A is a perspective view of a lower conductor plate, with a groove 43 being formed in the top surface of the lower conductor plate. FIG. 1B shows a state in which a substrate 30 is placed on the top surface of the lower conductor plate shown in FIG. 1A. The substrate 30 is such that various conductor patterns are formed on the top and bottom surfaces of the conductor plate, with a slot-line-input-type FET (millimetric-wave GaAs FET) 50 being mounted onto the top surface of the circuit substrate 30. Reference numerals 14 and 24 each denote a slot on the top surface of the substrate 30. Formed by disposing two conductors at a fixed distance, and, as will be described later, form two planar dielectric lines together with the opposing slot on the bottom surface of the substrate 30. Reference numerals 12 and 13 each denote a slot line formed at the end portions of the two planar dielectric lines (see also FIG. 5). Reference numerals 10 and 11 denote line-conversion conductor patterns which connects the planar dielectric lines 14, 24 and the slot lines 12, 13 (see also FIG. 5). Reference numerals 31 and 32 each denote a coplanar line, which supplies a gate bias voltage and a drain bias voltage to an FET 50. These two coplanar lines 31 and 32 are provided with filters indicated by F, and the peripheral portion of the coplanar lines 31 and 32 covers, as an RF-GND (grounding conductor), the top surface of the circuit substrate 30, and in the other area of the bottom surface of the circuit substrate 30, an RF-GND is formed.

Figure 2:
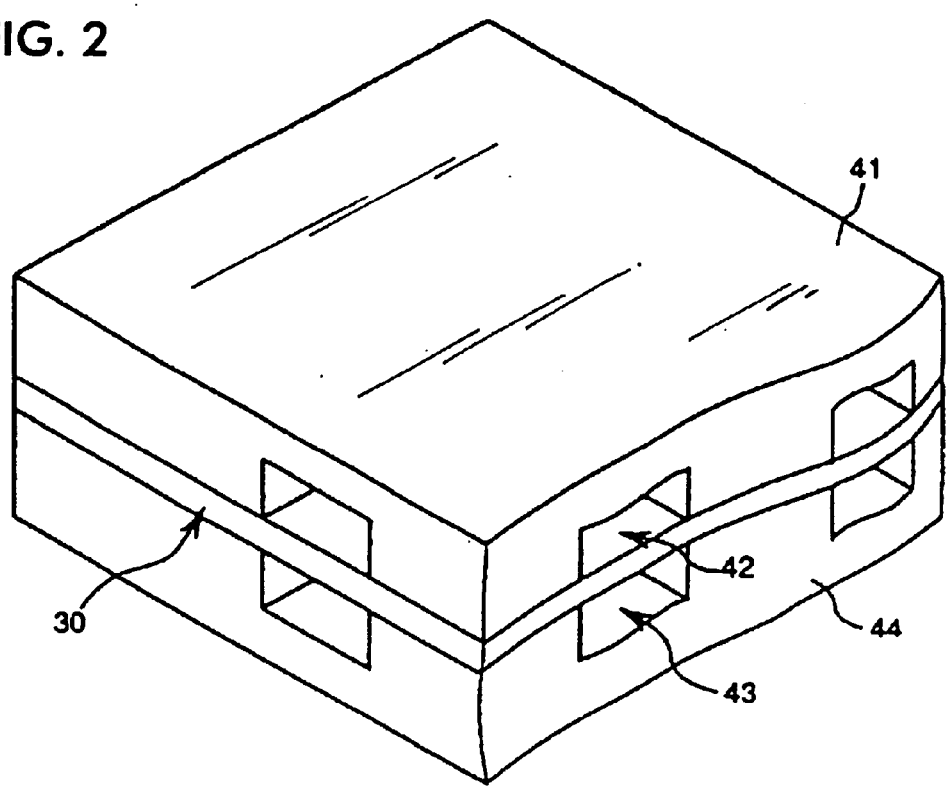
FIG. 2 is a perspective view showing the entire construction of the high-frequency amplifier.

FIG. 2 shows a state in which an upper-part conductor plate 41 is further placed on the top surface with respect to the state shown in FIG. 1B. By forming a groove in a plane symmetry (mirror symmetry) with respect to the groove of the lower conductor plate 44 in the inner surface of the upper-part conductor plate 41, a space section 42 is provided.

Figure 3:
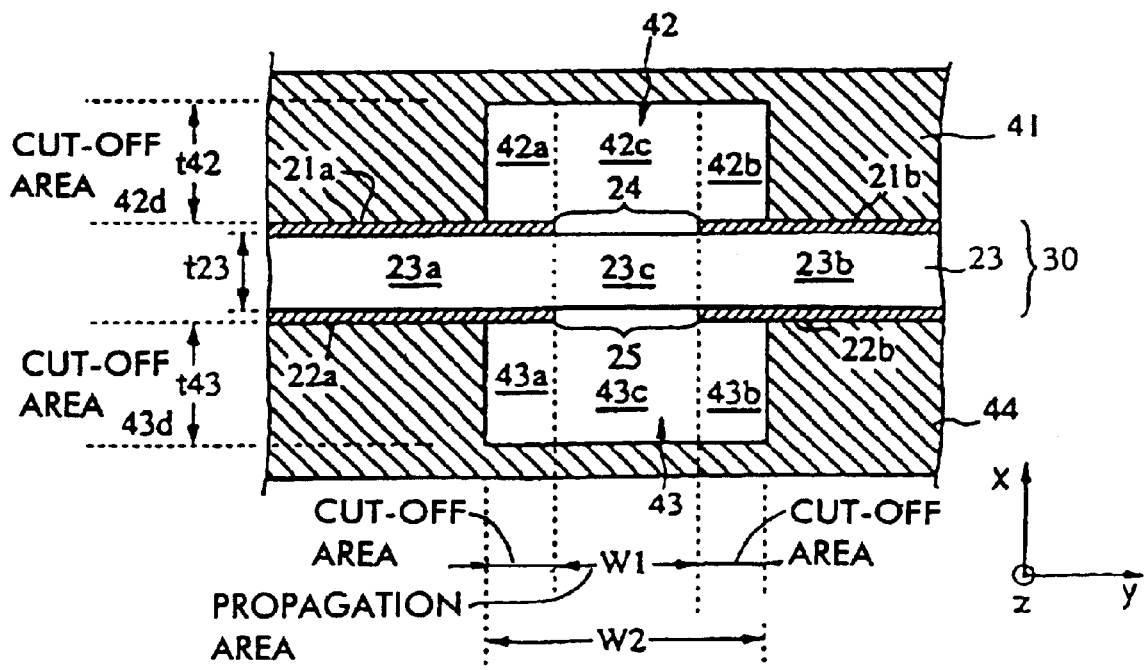
FIG. 3 is a sectional view of a planar dielectric line.

FIG. 3 is a sectional view passing through a slot 24 shown in FIG. 1B. In FIG. 3, reference numeral 23 denotes a conductor plate, with two conductor plates 21a and 21b being formed on the first main surface (the top surface in the figure) thereof, forming the portion indicated by 24 as a first slot. Further, two conductor plates 22a and 22b are formed on the second main surface (the bottom surface in the figure) of the conductor plate 23, forming the portion indicated by 25 as a second slot. The two conductor plates 41 and 44 are provided with spaces 42 and 43 near slots 24 and 25, and cause both the section between the conductor plates 21a and 21b and the section between the conductor plates 22a and 22b to conduct.

The portion indicated by 23c and having a width W1, shown in FIG. 3, which is provided in the conductor plate 23 between the opposing slots 24 and 25, becomes a propagation area in which a high-frequency signal having a desired propagation frequency fb is made to propagate. Further, the portions indicated by 23a and 23b on both sides, which sandwich the propagation area 23c, become cut-off areas.

Figure 4:
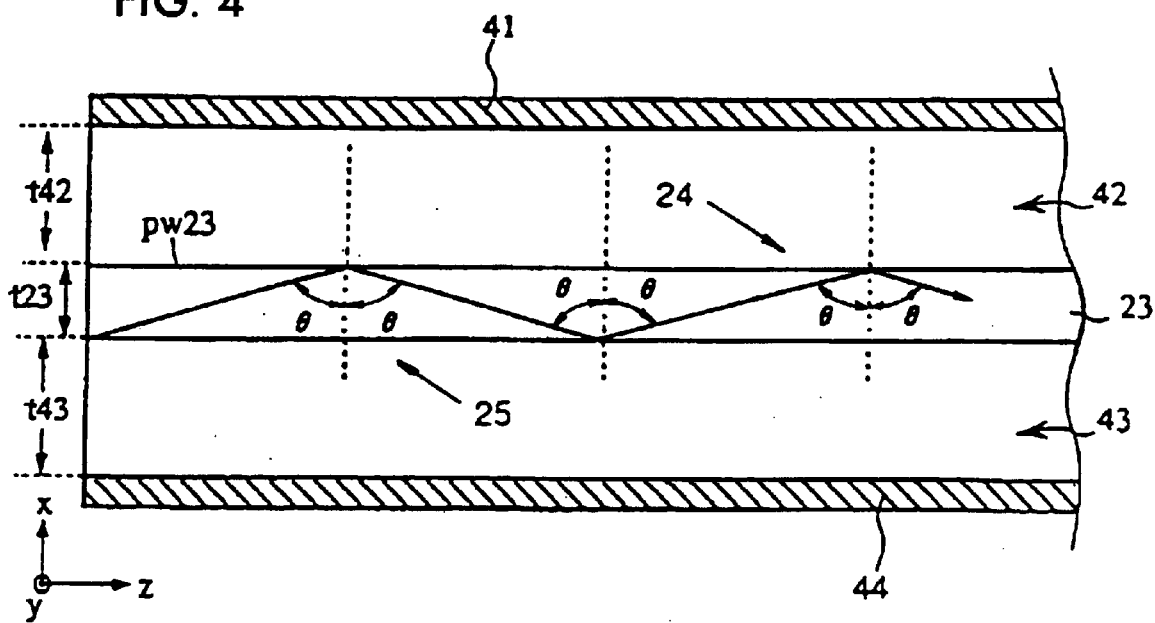
FIG. 4 is a sectional view of the planar dielectric line.

FIG. 4 is a sectional view in a plane in which the propagation area of the planar dielectric line shown in FIG. 3 passes in the direction of the propagation. As shown in FIG. 4, a plane electromagnetic wave pw23, which is an electromagnetic wave of a plane wave, enters the top surface (the slot 24 portion) of the conductor plate 23 at a predetermined incidence angle θ and is reflected at a reflection angle θ equal to the incidence angle θ. Further, the plane electromagnetic wave pw23 reflected on the top surface of the conductor plate 23 enters the bottom surface (the slot 25 portion) of the conductor plate 23 at an incidence angle θ and is reflected at a reflection angle θ equal to the incidence angle θ. Thereafter, the plane electromagnetic wave pw23 is repeatedly reflected alternately with the surfaces of the slots 24 and 25 portions of the conductor plate 23 as the boundary surfaces, and propagates through the propagation area 23c of the conductor plate 23 in the TE mode. In other words, the specific dielectric constant of the conductor plate 23 and the thickness t23 of the conductor plate 23 are determined so that the desired propagation frequency fb becomes equal to or greater than a critical frequency fda (the frequency at which a state is reached in which the incidence angle θ is decreased, the plane electromagnetic wave pw23 passes through the spaces 42 and 43, and the plane electromagnetic wave pw23 which propagates through the propagation area 23c is attenuated).

Opposing electrodes 21a and 22a with the conductor plate 23, shown in FIG. 3, interposed therebetween form a parallel-plate waveguide having a cut-off frequency sufficiently higher than the desired propagation frequency fb with respect to the TE wave. As a result, a cut-off area 23a with respect to the TE wave having electric-field components parallel to the electrodes 21a and 22a is formed on one side in the width direction of the conductor plate 23 sandwiched by the electrodes 21a and 22a. In a similar manner, electrodes 21b and 22b with the conductor plate 23 interposed therebetween form a parallel-plate waveguide having a cut-off frequency sufficiently higher than the desired propagation frequency fb with respect to the TE wave, and a cut-off area 23b with respect to the TE wave is formed on one side in the width direction of the conductor plate 23 sandwiched by the electrodes 21b and 22b.

Further, the top surface of the space 42 in FIG. 3 and the electrode 21a form a parallel-plate waveguide, and the thickness t42 thereof is set so that the cut-off frequency with respect to the TE wave of the parallel-plate waveguide becomes sufficiently higher than the desired propagation frequency fb. As a result, a cut-off area with respect to the TE wave is formed in the portion indicated by 42a. In a similar manner, a cut-off area with respect to the TB wave is formed in each of the portions indicated by 42b, 43a, and 43b. Propagation areas with respect to the TE wave are indicated by 42c and 43c.

The opposing inner surface (the longitudinal wall in the figure) of the space 42 forms a parallel-plate waveguide, and the width W2 thereof is set so that the cut-off frequency with respect to the TE wave of the parallel-plate waveguide becomes sufficiently higher than the desired propagation frequency fb, thereby forming a cut-off area 42d. For the space 43, similarly, a cut-off area 43d is formed.

As a result of forming the planar dielectric line as described above, it is possible to cause the electromagnetic-field energy of a high-frequency signal having a frequency equal to or higher than the critical frequency fda to be concentrated in the inside of the propagation area 23c and in the vicinity thereof and to cause the plane wave to propagate in the direction of the length (in the direction of the z axis) of the conductor plate 23. (Note the x, y and z directions indicated in FIGS. 3 and 4).

In the case where a signal of, for example, a 60-GHz band is propagated, if the specific dielectric constant of the conductor plate 23 is set at 20 to 30, and the plate thickness t at 0.3 to 0.8 μm, an appropriate line width W1 is 0.4 to 1.6 mm, and a characteristic impedance in a range of 30 to 200 Ω is obtained. Further, if a conductor plate having a specific dielectric constant of 20 or more is used as described above, energy of 90% or more is trapped within the conductor plate, and a transmission line with a very low loss because of total reflection can be realized.

The planar dielectric line shown in the above is similarly constructed in the portion where a slot 14 shown in FIG. 1B is formed.

Figure 5:
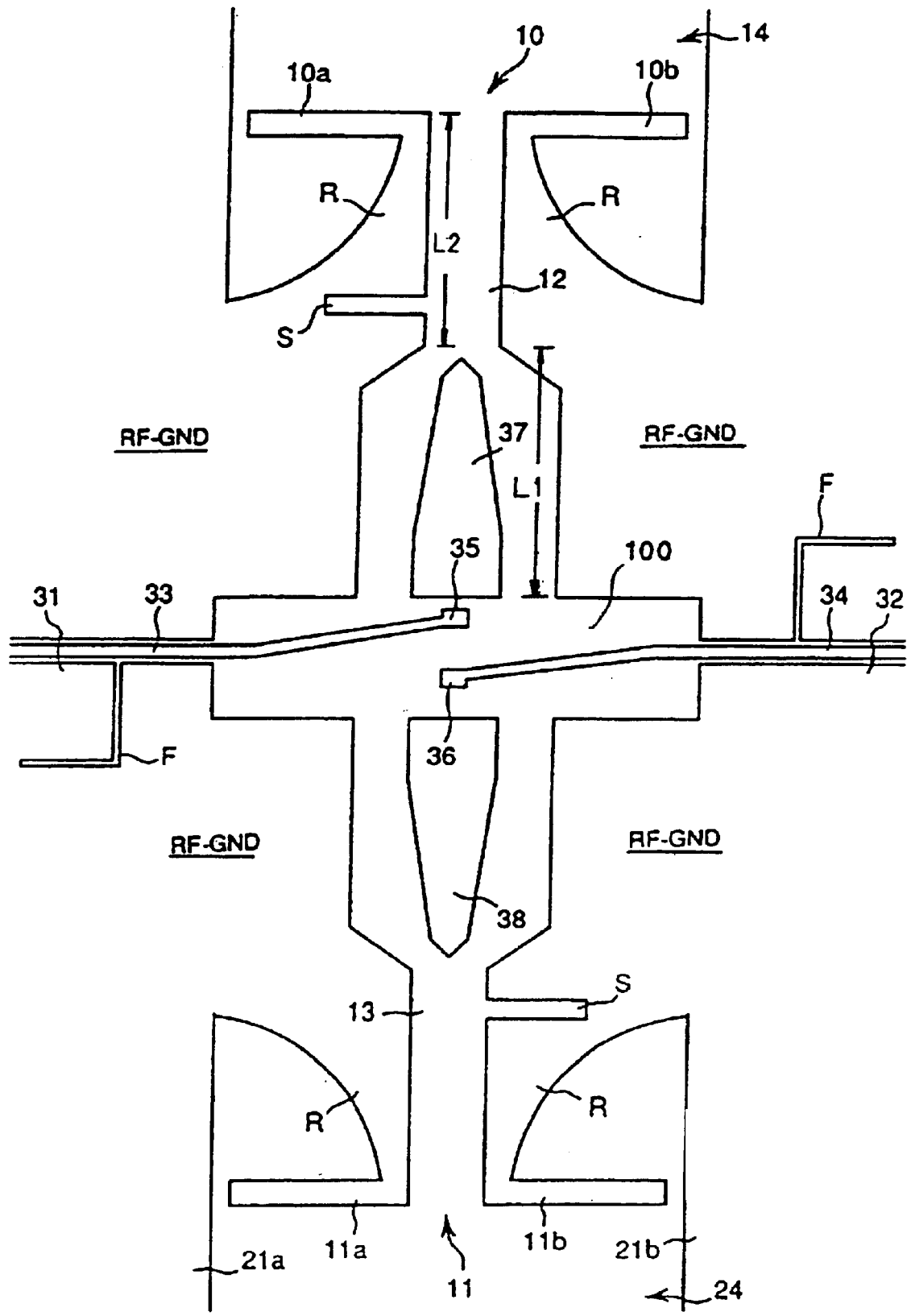
FIG. 5 is a view showing conductor patterns on a circuit substrate.

FIG. 5 is a view showing the conductor patterns of the main portion of the top surface of the circuit substrate 30. In FIG. 5, reference numerals 12 and 13 each denote a slot line, which is formed in each of the end portions of two planar dielectric line. Reference numerals 10 and 11 each denote a line-conversion conductor pattern, which is formed in the shape of a dipole antenna, as indicated by 10a, 10b, 11a, and 11b, respectively. Other shapes of the portions 10a, 10b, 11a and 11b are possible as long as the portions function as dipole antennas. The base portions of the line-conversion conductor patterns 10 and 11 form impedance matching sections R which are tapered moderately from the slot lines 12 and 13 toward the line-conversion conductor patterns 10 and 11 in order that the wiring resistance of the line-conversion conductor patterns 10 and 11 is reduced to decrease the conversion loss. If the wavelength of the frequency in the used frequency band in each of the electrode patterns 10a, 10b, 11a and 11b and the impedance matching section R is denoted as λ, they have a length of nearly λ/4, and the width of the slot lines 12 and 13 is determined by the characteristics impedance of the designed line. Assuming that $Z_1$ is the input impedance of a portion 100, $Z_{01}$ is the impedance of a portion $L_1$ and $Z_{02}$ is the impedance of a portion $L_2$, it is preferable that the relation of these values is given by the following equation:

$$Z_1=((Z_{02})^2/(Z_{01})^2)*Z_{in}$$

For example, a characteristic impedance of 30 to 100 Ω can be realized at a width of 0.05 to 0.20 mm. As described above, the characteristics impedance of the planar dielectric line is 30 to 200 Ω, and the input/output impedance of the FET (millimetric-wave GaAs FET) 50 (see FIG. 1B) is usually 30 to 90 Ω; therefore, the three, including the planar dielectric line, the slot line, and the FET, easily obtain impedance matching.

Further, if a short stub S is provided at the midpoint of the slot lines 12 and 13, it is possible to obtain impedance matching easily between the line-conversion conductor patterns and the FET by appropriately selecting the stub length.

In FIG. 5, reference numerals 37 and 38 denote conductors for branching the slot line, reference numeral 35 denotes a gate terminal, and reference numeral 36 denotes a drain terminal, to which is connected each terminal of the FET to be described later. Reference numerals 31 and 32 each denote a coplanar line, with the center conductors 33 and 34 thereof being extended out to the gate terminal 35 and the drain terminal 36, respectively. As also shown in FIG. 1B, filters which function as low-pass filters indicated by F are at the midpoint of the coplanar lines 31 and 32 so that the RF signal does not leak to the bias circuit side and does not propagate.

Between the two planar dielectric lines, an RF-GND is provided, and a distance is required such that a high-frequency signal is cut off between the two planar dielectric lines; a width equal to or greater than 1 mm is sufficient. As shown in FIG. 5, since the RF-GND is present in the periphery of the area where the FET is mounted, the high-frequency signal does not leak between the two planar dielectric lines.

Figure 6:
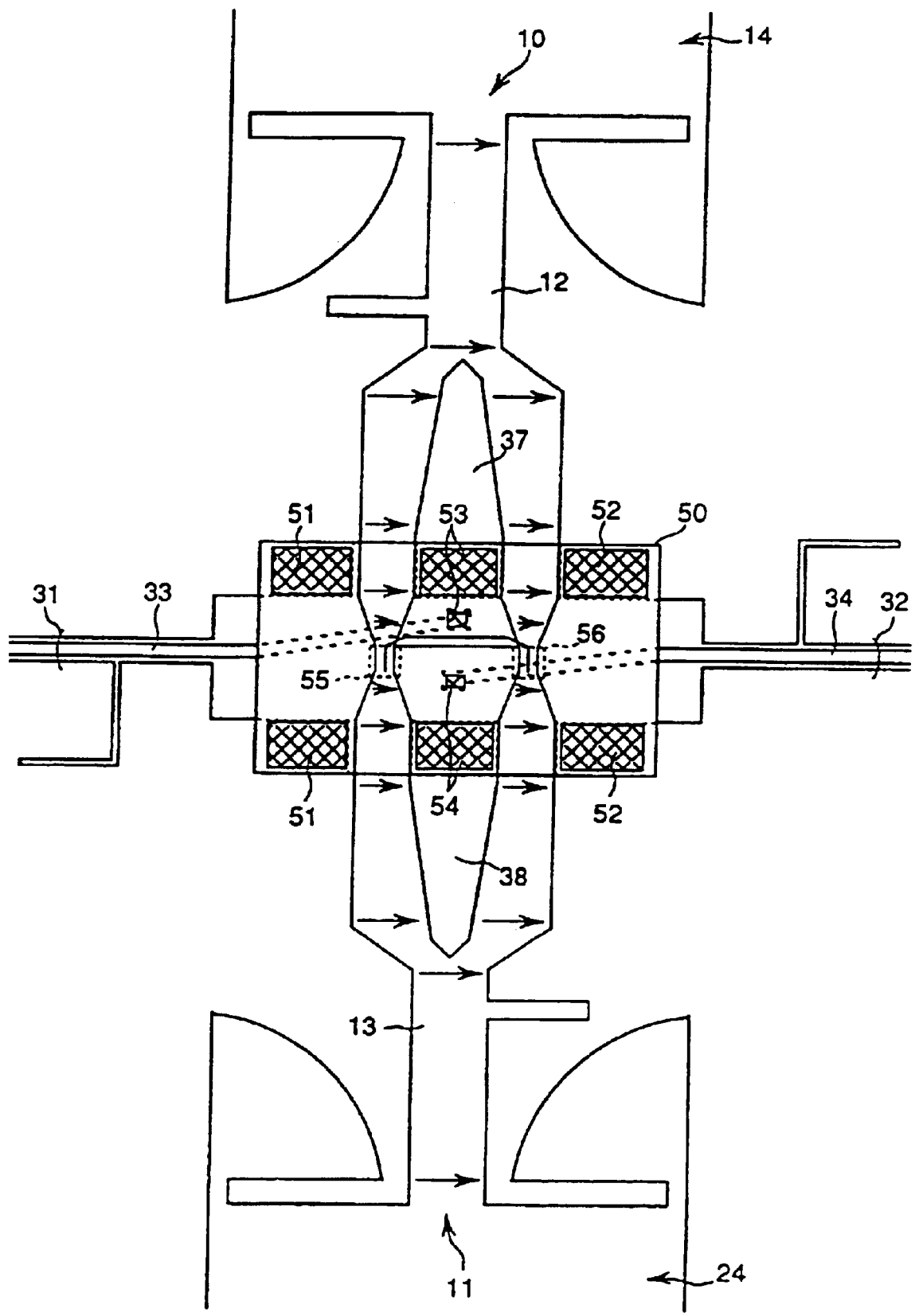
FIG. 6 is a view showing a state in which an FET (field-effect transistor) is mounted with respect to FIG. 5.

FIG. 6 is a view showing a state in which the FET 50 is mounted with respect to the state shown in FIG. 5. In FIG. 6, reference numerals 51 and 52 denote the source terminals of the FET 50, reference numeral 53 denotes a gate terminal, and reference numeral 54 denotes a drain terminal. The portions indicated by 55 and 56 are active areas. A field-effect transistor, such as an MES-FET (metal semiconductor FET) or a HEMT (high electron mobility transistor), is formed in each of the portions, and the source terminals 51 and 52, the gate terminal 53, and the drawing terminal 54 are extended out. Between the source terminals 51, and the gate terminal 53 and the drain terminal 54, and between the gate terminal 53 and the drain terminal 54, and the source terminals 52, a slot line is formed, as shown in the figure. The cross-hatched portion is a viahole formation portion, and each terminal is extended out to the back-surface side of the chip. If a gate bias voltage and a drain bias voltage are applied via the center conductors 33 and 34 of the coplanar lines 31 and 32, respectively, the FET 50 forms a complementary amplifying circuit. The arrows in the figure show the electric-field distribution of a signal which propagates through the slot lines 12 and 13. The signal of the LSM mode, which propagates from top to bottom in the figure through the planar dielectric line including the slot indicated by 14 in the figure, is converted into a mode (TE mode) of the slot line via the line-conversion conductor pattern 10, and this TE mode signal propagates through the slot line 12 and is applied, as a voltage signal, between the source and the gate of the FET 50. And the voltage signal between the source and the drain propagates through the slot line 13 again in the TE mode, and further, is converted into an LSM-mode signal via the line-conversion conductor pattern 11. This signal is propagated through the planar dielectric line, including the slot indicated by 24, in the downward direction in the figure.

Although in the example shown in FIG. 6 the chip is mounted in such a way that the surface on which the semiconductor devices are formed becomes the top surface, the chip may be mounted in such a way that the surface on which the semiconductor devices are formed faces downwards, and the circuit substrate 30 and the slot line of the FET are directly bump-connected. In this case, the slot line of the FET must be spaced apart from the dielectric plate by more than some tens of λm in order to prevent parasitic coupling with the dielectric plate, and a high degree of bump connection technology is required. However, since viaholes are not necessary, the construction of the FET can be simplified.

As stated above, since in this high-frequency amplifier a planar dielectric line having a large effect of trapping a propagation electromagnetic field is used for input and output, parasitic coupling between this circuit and external circuits can be prevented. Further, since Q of the planar dielectric line is high (in the above-described example, Q>500), it is possible to minimize the transmission loss. Further, since the electrode patterns on the circuit substrate can be produced by using technology similar to a conventional circuit-substrate manufacturing technology using photolithography, the electrode patterns can be manufactured very easily and at a low cost. Furthermore, in this embodiment, there are two gate fingers (the electrodes which extend from the gate terminal to the active area) of the FET, and an RF signal at a phase opposite to the source electrode is input to the two gates; therefore, even harmonic waves are suppressed, and power load efficiency is high.

Since the number of gate fingers of the FET can be freely realized by branching the slot line, design is possible with ease according to a required amplification factor and output power.

Next, the construction of a voltage controlled oscillator (hereinafter referred to as a "VCO") according to a second embodiment of the present invention will be described with reference to FIGS. 7 to 9.

Figure 7:
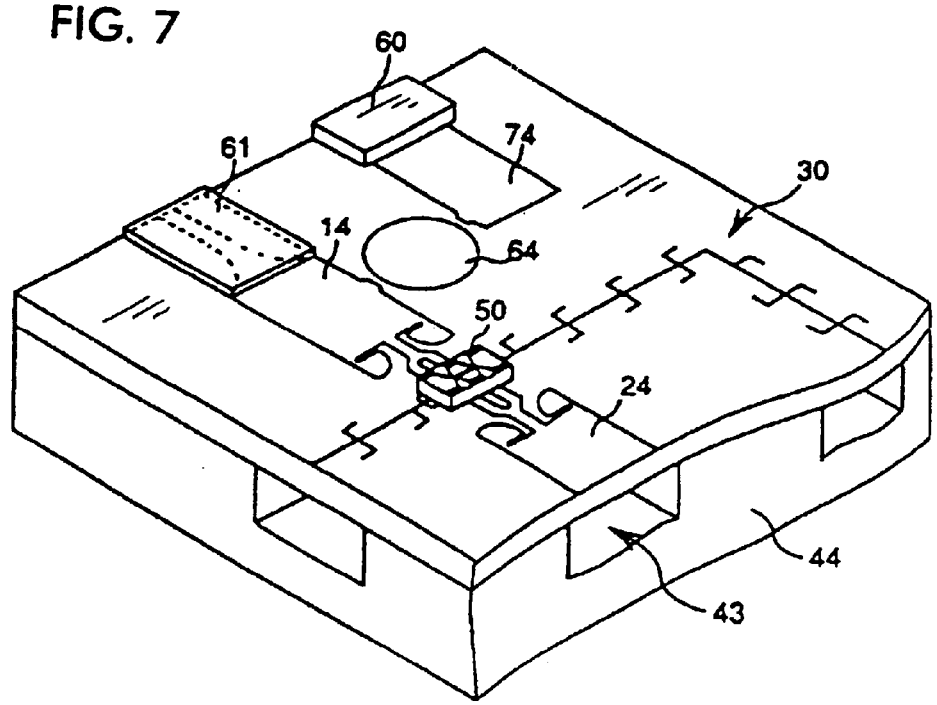
FIG. 7 is an exploded perspective view showing the construction of a VCO according to a second embodiment of the present invention.
Figure 8:
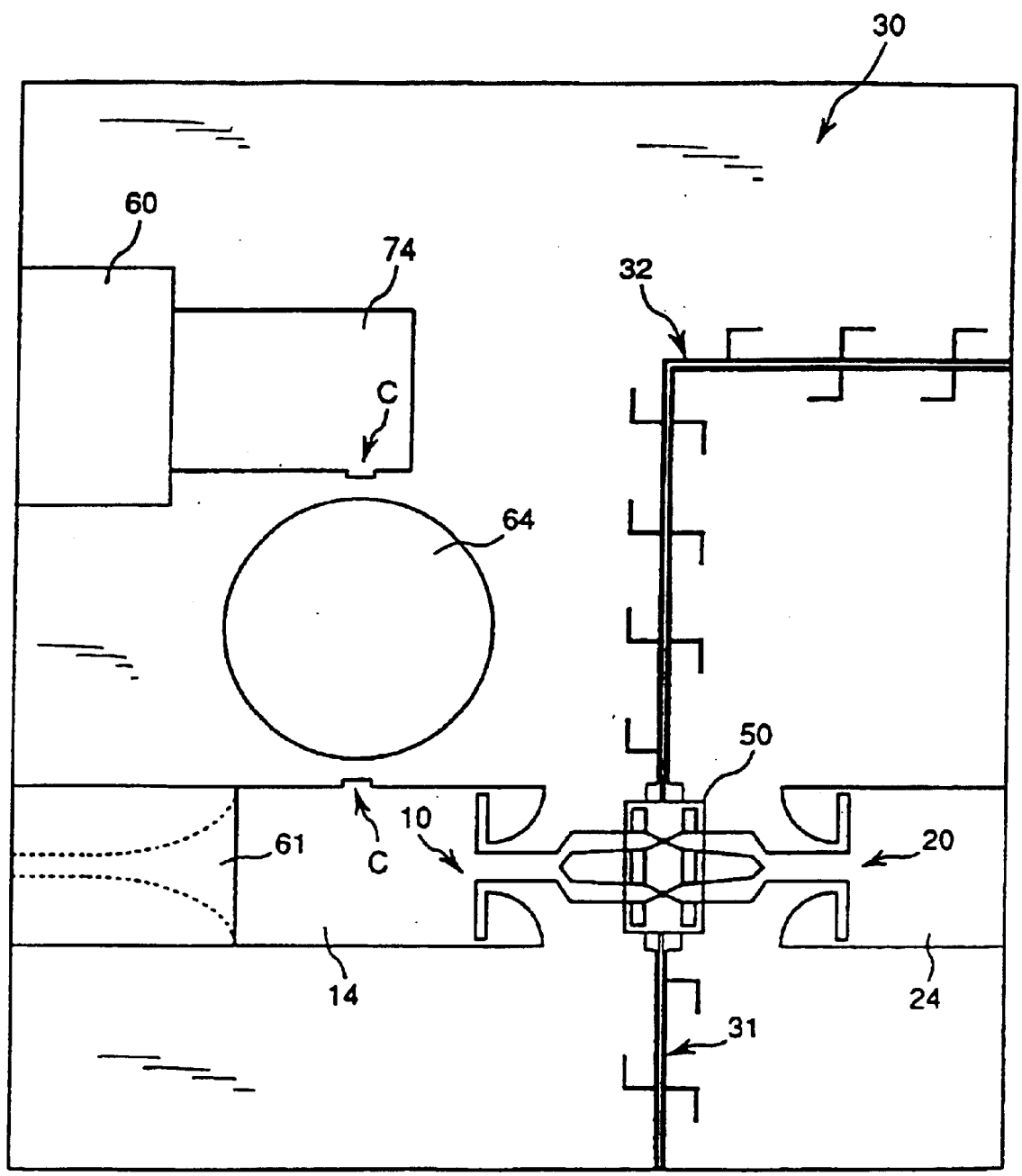
FIG. 8 is a plan view of a circuit substrate of a VCO according to the second embodiment of the present invention.

FIG. 7 is a perspective view in a state in which the circuit substrate 30 is placed on the lower conductor plate 44. FIG. 8 is a elan view of the circuit substrate 30 shown in FIG. 7. This VCO is such that a resonator and a variable capacitive element are provided in the high-frequency amplifier shown in FIG. 1B. In FIGS. 7 and 8, reference numeral 61 denotes a thin-film resistor, with the termination portion of the slot 14 formed on the top surface of the circuit substrate 30 being formed into a tapered shape and this thin-film resistor 61 being provided thereon. Reference numeral 74 denotes another slot provided on the top surface of the circuit substrate 30 and, as will be described later, a slot is also provided on the back-surface side of the circuit substrate 30 with the circuit substrate 30 interposed in between, forming the planar dielectric line. Reference numeral 60 denotes a variable capacitive element mounted in such a manner as to be extended over a slot 74, whose capacitance varies according to an applied voltage. As this variable capacitance element, a variable capacitance capacitor disclosed in Japanese Unexamined Patent Publication No. 5-74655, and a conventional variable capacitance diode may be used. Reference numeral 64 in the figure denotes a section where no conductor is formed, for providing a dielectric resonator, provided on the top surface of the circuit substrate 30 and, together with the opposing conductor non-formation section for a dielectric resonator on the back-surface side of the circuit substrate 30 with this substrate interposed in between, dorms a dielectric resonator of the TE010 mode in this portion. The remaining construction is the same as that of the first embodiment, and the top of the circuit substrate 30 shown in FIGS. 7 and 8 is covered by an upper-part conductor plate.

Figure 9:
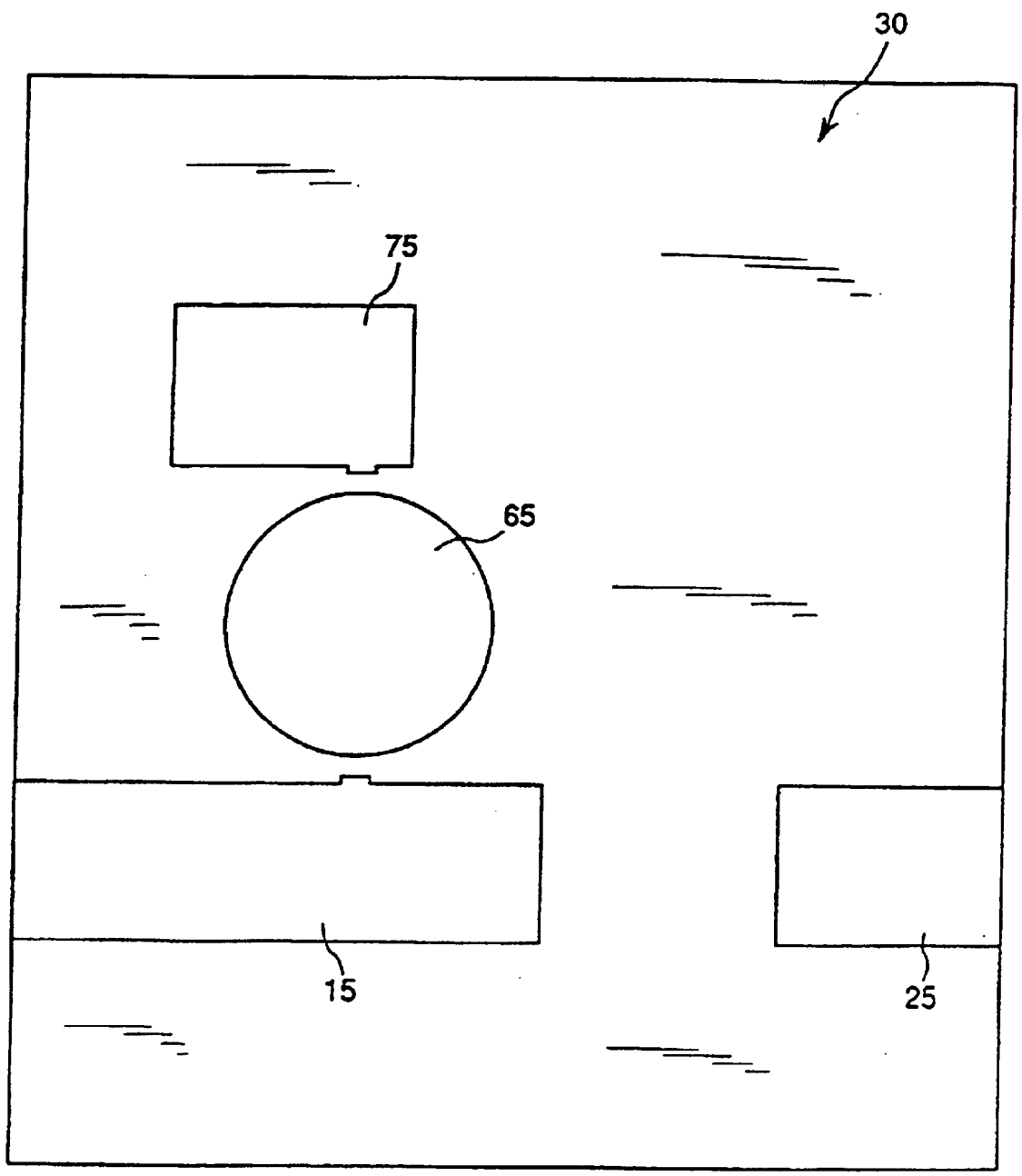
FIG. 9 is a view showing conductor patterns on the back-surface side of the circuit substrate.

FIG. 9 is a view showing the construction of the back-surface side of the circuit substrate 30. However, FIG. 9 is a view when the circuit substrate 30 is not viewed from the back-surface side but viewed from the top surface thereof. As described above for FIGS. 7 and 8, by forming the slots 14, 24, 74, 15, 25, and 75 on both main surfaces of the circuit substrate 30 with a dielectric plate interposed therebetween, three planar dielectric lines are constructed, and further, no conductor is formed at sections 64 and 65 so as to provide a dielectric resonator, thus a dielectric resonator of the TE010 mode having a large effect of trapping an electromagnetic field is constructed in this portion. Grooves of the upper and lower conductor plates are made to oppose each other to form a space section in three mounting sections in each of the planar dielectric line, the slot line, and the FET 30, and the periphery of the section where the coplanar lines 31 and 32 are formed. In this way, a band-reflection-type oscillator is constructed. Here, in the case where the specific dielectric constant of the dielectric plate is 24 and the thickness is 0.3 mm, if the diameter of the conductor non-formation sections 64 and 65 for a dielectric resonator is set at 1.7 mm, the resonance frequency thereof can be set to 60 GHz. Since this resonator and the planar dielectric line are not electromagnetically coupled to each other by merely bringing them close to each other, a very small cut-out section for coupling, indicated by C in FIG. 8, is formed. A cut-out section, which is as small as the width being about 0.2 to 0.3 mm and the depth being about 0.05 to 0.1 mm, makes it possible to obtain sufficient coupling. With this construction, if the capacitance of the variable capacitive element 60 is varied, the impedance of the planar dielectric line, including the slot 74, varies, causing the resonance frequency of this planar dielectric line to vary. As a result, the resonance frequency of the dielectric resonator coupled to this line varies, making it possible to vary the oscillation frequency of the VCO.

In the VCO according to the second embodiment, since a dielectric resonator of the TE010 mode having a large effect of trapping an electromagnetic field is used, even if this resonator is disposed close to the FET 50, the FET 50 and the resonator are not parasitically coupled to each other, and the circuit module can be formed into a small size. Further, since the planar dielectric line and the dielectric resonator of the TE010 mode has a very high Q (Q>500) also in the millimetric wave, it is possible to increase the load Q of the entire resonance circuit and to suppress the phase noise of the oscillator.

Figure 10:
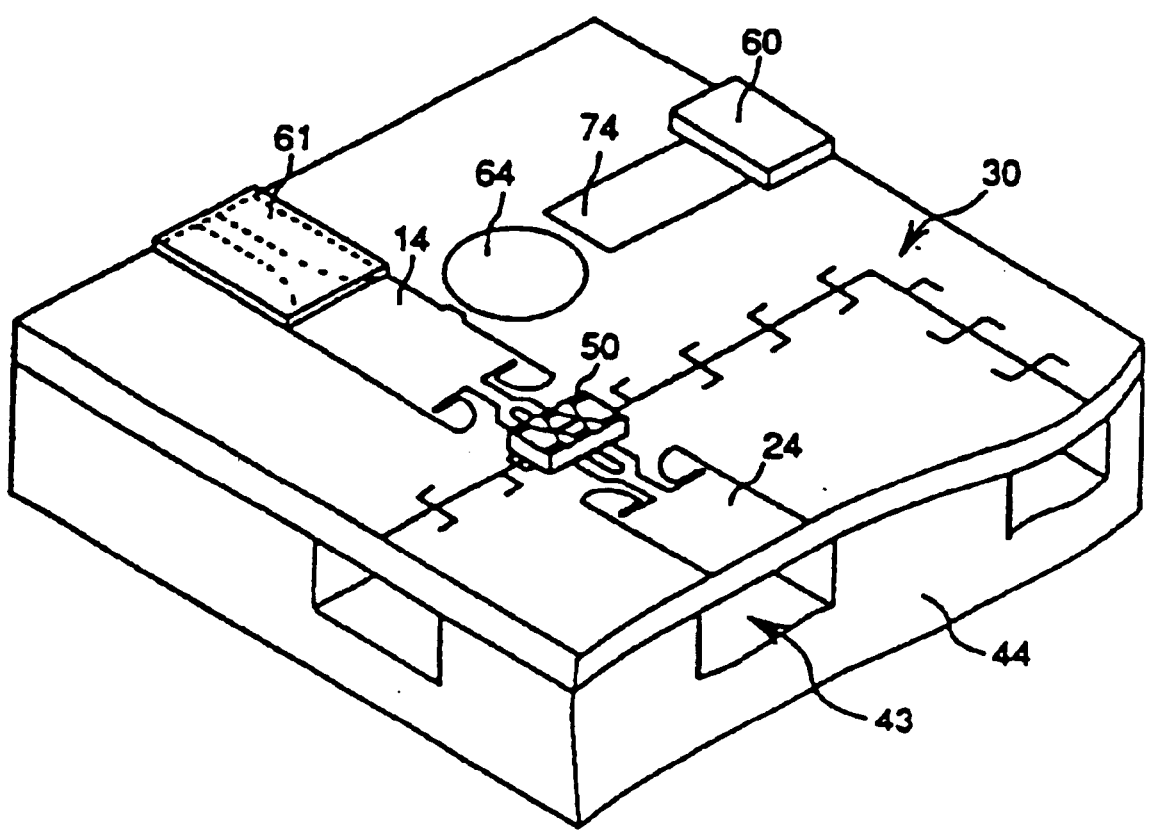
FIG. 10 is an exploded perspective view showing the construction of a VCO according to a third embodiment of the present invention.

Next, the construction of a VCO according to a third embodiment of the present invention will be described with reference to FIG. 10. The difference from the VCO shown in FIG. 7 is the positional relationship between the planar dielectric line, including the slot 74, and the dielectric resonator. That is, whereas, in FIG. 7, the dielectric resonator is disposed on the side of the planar dielectric line (subline), including the slot 74, in FIG. 10, the dielectric resonator is disposed in the front of the subline. According to this construction, the size of the module may be larger than that shown in FIG. 7, but stronger coupling is obtained in the front portion of the subline, thereby making the coupling between the dielectric resonator and the planar dielectric line easier.

According to the invention, since the space between the planar dielectric line and the electronic components is connected via the line-conversion conductor pattern and the slot line, it is possible to perform integration by reducing the signal loss in the coupled section of the planar dielectric line and the electronic components and while maintaining a low loss characteristic, which is a feature of the planar dielectric line.

According to the invention, when the signal is propagated from one planar dielectric line of the two planar dielectric lines to the other planar dielectric line, the signal is converted into the mode of the slot line at the midpoint by the line-conversion conductor pattern and the slot line, and signal conversion is performed by the electronic components, and then the signal is returned to the mode of the planar dielectric line via the line-conversion conductor pattern. Therefore, signal conversion using electronic components is made possible with a construction with a small energy conversion loss while performing the propagation of a signal using the planar dielectric line.

According to the invention impedance matching is obtained between the line-conversion conductor pattern and the electronic components, and the loss in the connection section of the slot line and the electronic components is reduced.

According to the invention, matching is obtained between the line-conversion conductor pattern and the planar dielectric line, and the slot line, thereby suppressing unwanted reflection and reducing the transmission loss caused by line conversion.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A planar dielectric integrated circuit, comprising:
   a first planar dielectric line comprising: a first slot which is provided by disposing two conductors at a fixed distance apart on a first main surface of a dielectric plate, and a second slot, which opposes the first slot and is provided by disposing two conductors at a fixed distance apart on a second main surface of said dielectric plate, with a region sandwiched between said first slot and said second slot being provided as a plane-wave propagation region;
   a dielectric resonator provided by a pair of mutually opposing conductor-free portions within corresponding ones of said conductors on said first and second main surfaces of said dielectric plate, said dielectric resonator being electromagnetically coupled to said first planar dielectric line;
   a slot line provided at an end portion of said first planar dielectric line on said dielectric plate;
   line conversion conductor patterns which are connected to said first planar dielectric line and which are used to perform mode conversion between said first planar dielectric line and said slot line; and
   electronic components disposed in such a manner as to be extended over said slot line.

2. The circuit of claim 1, further comprising:
   a second planar dielectric line comprising: a third slot which is provided by disposing two conductors at a fixed distance apart on said first main surface of said dielectric plate, and a fourth slot, which opposes the third slot and is provided by disposing two conductors at a fixed distance apart on said second main surface of said dielectric plate, with a region sandwiched between said third slot and said fourth slot being provided as a plane-wave propagation region;
   said second planar dielectric line being electromagnetically coupled to said dielectric resonator.

3. The circuit according to claim 2, further comprising:
   at least one conductive plate adjacent one of the first and second main surfaces of the dielectric plate, the conductive plate having at least one groove in a surface thereof, the at least one groove opposing at least one of the first planar dielectric line, the slot line, the line-conversion conductor patterns, and the second planar dielectric line.

4. The circuit according to claim 3, wherein a width of the at least one groove is greater than a width of one of the first planar dielectric line and the second planar dielectric line.

5. The circuit according to claim 4, wherein the width of the at least one groove is set such that a cut-off area is formed, the cut-off area having a propagation frequency which is higher than a desired propagation frequency of the plane-wave propagation region.

6. The circuit according to claim 5, wherein a depth of the at least one groove is set such that a cut-off area is formed, the cut-off area having a propagation frequency which is higher than a desired propagation frequency of the plane-wave propagation region.

7. The circuit of claim 2, wherein said dielectric resonator is coupled to an end of said second planar dielectric line.

8. The circuit of claim 1, further comprising:
   a conductive plate adjacent at least one of the first and second main surfaces of the dielectric plate, the conductive plate having at least one groove in a surface thereof, the at least one groove opposing at least one of the first planar dielectric line, the slot line and the line-conversion conductor patterns.

9. The circuit according to claim 8, wherein a width of the at least one groove is greater than a width of the first planar dielectric line.

10. The circuit according to claim 9, wherein the width of the at least one groove is set such that a cut-off area is formed, the cut-off area having a propagation frequency which is higher than a desired propagation frequency of the plane-wave propagation region.

11. The circuit according to claim 9, wherein a depth of the at least one groove is set such that a cut-off area is formed, the cut-off area having a propagation frequency which is higher than a desired propagation frequency of the plane-wave propagation region.

12. A planar dielectric integrated circuit, comprising:
    a first planar dielectric line comprising: a first slot which is provided by disposing two conductors at a fixed distance apart on a first main surface of a dielectric plate, and a second slot, which opposes the first slot and is provided by disposing two conductors at a fixed distance apart on a second main surface of said dielectric plate, with a region sandwiched between said first slot and said second slot being provided as a plane-wave propagation region;
    a slot line provided at an end portion of said first planar dielectric line on said dielectric plate;
    line-conversion conductor patterns which are connected to said first planar dielectric line and which are used to perform mode conversion between said first planar dielectric line and said slot line; and
    electronic components disposed in such a manner as to be extended over said slot line.

13. The circuit of claim 12, further comprising:
    a conductive plate adjacent at least one of the first and second main surfaces of the dielectric plate, the conductive plate having at least one groove in a surface thereof, the at least one groove opposing at least one of the first planar dielectric line, the slot line and the line-conversion conductor patterns.

14. The circuit according to claim 13, wherein a width of the at least one groove is greater than a width of the first planar dielectric line.

15. The circuit according to claim 14, wherein the width of the at least one groove is set such that a cut-off area is formed, the cut-off area having a propagation frequency which is higher than a desired propagation frequency of the plane-wave propagation region.

16. The circuit according to claim 15, wherein a depth of the at least one groove is set such that a cut-off area is formed, the cut-off area having a propagation frequency which is higher than a desired propagation frequency of the plane-wave propagation region.

* * * * *